(12) United States Patent
Huang (10) Patent No.: US 10,937,728 B2
(45) Date of Patent: Mar. 2, 2021

(54) PREFORMED LEAD FRAME AND LEAD FRAME PACKAGE MADE FROM THE SAME

(71) Applicant: CHANG WAH TECHNOLOGY CO., LTD., Kaohsiung (TW)

(72) Inventor: Chia-Neng Huang, Kaohsiung (TW)

(73) Assignee: Chang Wah Technology Co., Ltd., Kaohsiung (TW)

( * ) Notice: Subject to any disclaimer, the term of this patent is extended or adjusted under 35 U.S.C. 154(b) by 62 days.

(21) Appl. No.: 16/447,350

(22) Filed: Jun. 20, 2019

(65) Prior Publication Data
US 2020/0251412 A1 Aug. 6, 2020

(30) Foreign Application Priority Data
Jan. 31, 2019 (TW) .................. 108201596

(51) Int. Cl.
*H01L 23/495* (2006.01)
*H01L 23/498* (2006.01)
*H01L 21/48* (2006.01)
*H01L 23/00* (2006.01)

(52) U.S. Cl.
CPC .... *H01L 23/49861* (2013.01); *H01L 21/4828* (2013.01); *H01L 21/4839* (2013.01); *H01L 23/49838* (2013.01); *H01L 24/48* (2013.01); H01L 2224/48245 (2013.01)

(58) Field of Classification Search
CPC ........... H01L 23/49861; H01L 21/4828; H01L 21/4839; H01L 23/49838; H01L 24/48; H01L 2224/48245; H01L 23/3121; H01L 23/3107; H01L 21/4842; H01L 21/561; H01L 23/49582; H01L 23/49548; H01L 2224/97; H01L 2224/48091; H01L 2224/48247; H01L 2924/181
See application file for complete search history.

(56) References Cited

U.S. PATENT DOCUMENTS

2016/0148877 A1 5/2016 Kitnarong et al.
2018/0122731 A1* 5/2018 Komatsu ............... H01L 21/561

\* cited by examiner

*Primary Examiner* — Robert G Bachner
(74) *Attorney, Agent, or Firm* — Muncy, Geissler, Olds & Lowe, P.C.

(57) ABSTRACT

A preformed lead frame includes multiple lead frame units, a connecting member connecting the lead frame units, a molding layer molded over the lead frame units and the connecting member, and a solder layer. The molding layer has opposite upper and lower surfaces, a plurality of side surfaces each extending therebetween, and a plurality of spaced-apart elongated grooves indented from the lower surface towards the upper surface. Each of the lead frame units includes a row of spaced-apart leads each having a grooved surface and a grooved soldering surface indented from the grooved surface towards the upper surface. The solder unit includes multiple solder layers for filling the elongated grooves. A lead frame package formed from the preformed lead frame is also disclosed.

16 Claims, 9 Drawing Sheets

PREFORMED LEAD FRAME AND LEAD FRAME PACKAGE MADE FROM THE SAME

CROSS-REFERENCE TO RELATED APPLICATION

This application claims priority of Taiwanese Utility Model Patent Application No. 108201596, filed on Jan. 31, 2019.

FIELD

This disclosure relates to a preformed lead frame, and more particularly to a preformed lead frame formed with elongated grooves each filled with a solder layer and used for solder reflowing. This disclosure also relates to a lead frame package made from the preformed lead frame.

BACKGROUND

A conventional quad flat no-lead (QFN) package typically has a smaller size due to a lack of pins extruding beyond edges of the package. However, when the QFN package is used and must be soldered to an external circuit board, the lack of outwardly extruding pins makes it more difficult for the solder to rise to the side faces of the pins from the bottom surfaces of the pins during a subsequent reflow soldering process. This is undesirable as the bonding strength between the QFN package and the external circuit board largely depends on the contact surface area between the solder and the pins. Further, when the solder cannot be seen from the side faces of the pins, it is impossible to visually check the condition of contact between the solder and the pins during the manufacturing process, and thus increases the difficulty of quality control.

Figure 1:
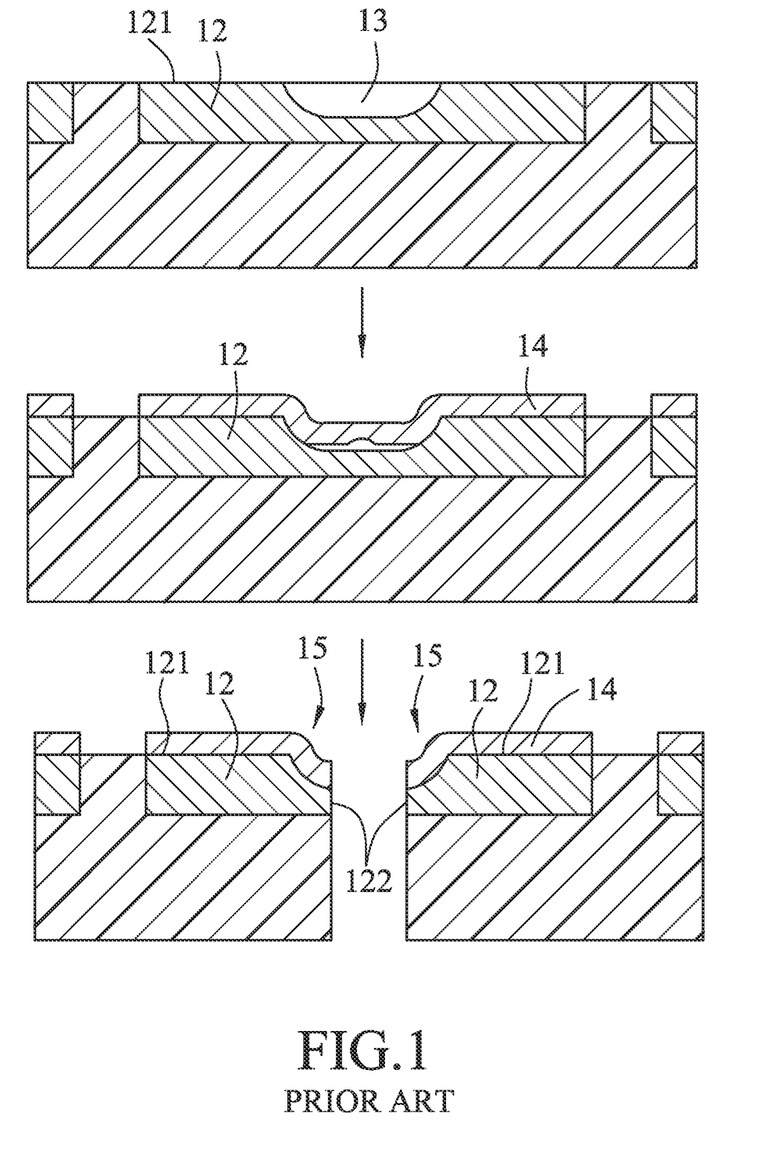
FIG. 1 is a schematic view illustrating consecutive steps for making a conventional QFN package.

Referring to FIG. 1, in order to allow easier reflow of the solder and increase the contact surface between the solder and the pins such that the strength and reliability of the soldering are improved and the state of the soldering can be more easily observed visually, U.S. Patent Application Publication No. 2016/0148877A1 discloses a method of making a QFN package with improved contact pins, which involves double sawing a lead frame after the wire bonding and packaging processes are completed. The method includes sawing a step cut into the pins 12 so as to form a groove 13 using a first saw width without separating the pins 12, forming an electroplated coating 14 on the pins 12 and the groove 13, and severing the pins 12 completely using a second saw width less than the first saw width so as to produce singulated QFN packages. Each of the QFN packages is formed with a step cut structure 15 on the side face 122 of each of the pins 12 exposed after the severing. Therefore, when the QFN packages are individually soldered to the external circuit board, such design allows the solder to reflow from the bottom surfaces 121 of the pins 12 back to the side surfaces 122 of the pins through the step cut structures 15, which increases the contact surface area between the pins 12 and the solder, thus enhancing the bonding strength between the QFN package and the external circuit board and allowing the condition of soldering to be visually observed. However, in order to form the step cut structure 15 of the pins 12, double sawing is required after packaging, which not only increases manufacturing time, but also increases manufacturing costs. Moreover, metal burrs may be formed during the double sawing process, which may have undesirable effects on neighboring portions of the pins 12, and may result in a quality drop for the package.

SUMMARY

Therefore, a first object of the disclosure is to provide a preformed lead frame so as to alleviate or eliminate the aforesaid shortcomings of the conventional QFN package. A second object of the disclosure is to provide a lead frame package made from the preformed lead frame.

According to the first aspect of the disclosure, a preformed lead frame includes at least two lead frame units, at least one connecting member extending along a scribe line and connecting between the at least two lead frame units, a molding layer molded over the at least two lead frame units and the at least one connecting member, and a solder unit. The molding layer has opposite upper and lower surfaces, a plurality of spaced apart elongated grooves indented from the lower surface toward the upper surface, and a plurality of side surfaces each extending between the upper and lower surfaces and surrounding a respective one of the elongated grooves. The solder unit includes a plurality of solder layers each of which fills a respective one of the elongated grooves.

Each of the at least two lead frame unit includes a row of spaced-apart leads. The leads of one of the at least two lead frame units are respectively and alignedly connected to the leads of the other one of the at least two lead frame units via the at least one connecting member. Each of the leads has a wire connecting surface exposed from the upper surface of the molding layer, a grooved surface opposite to the wire connecting surface of the molding layer, and a grooved soldering surface indented from the grooved surface towards the upper surface of the molding layer and exposed in one of the elongated grooves.

Each of the solder layers covers the grooved soldering surface of the respective elongated groove and is connected to a portion of the respective side surface of the molding layer exposed in the respective elongated groove.

According to the second aspect of the disclosure, a lead frame package includes a molding layer, a lead frame unit, a solder unit and a chip unit.

The molding layer has opposite upper and lower surfaces, a lateral surface interconnecting the upper and lower surfaces, a framed portion extending between the upper and lower surfaces, and a surrounding frame portion extending between the upper and lower surfaces and connectively surrounding the framed portion.

The lead frame unit includes a plurality of spaced-apart leads embedded in the surrounding frame portion of the molding layer. Each of the leads has a wire connecting surface exposed from the upper surface of the molding layer, a grooved surface opposite to the wire connecting surface and exposed from the lower surface of the molding layer, and a grooved soldering surface indented from the grooved surface towards the upper surface of the molding layer. The grooved soldering surface of each of the leads cooperates with the molding layer to define a solder-receiving groove.

The solder unit includes a plurality of solder layers. Each of the solder layers fills a respective one of the solder-receiving groove.

The chip unit includes a chip that is disposed on the framed portion of the molding layer, and a plurality of wires connected between the chip and the wire connecting surfaces of the leads.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 2:
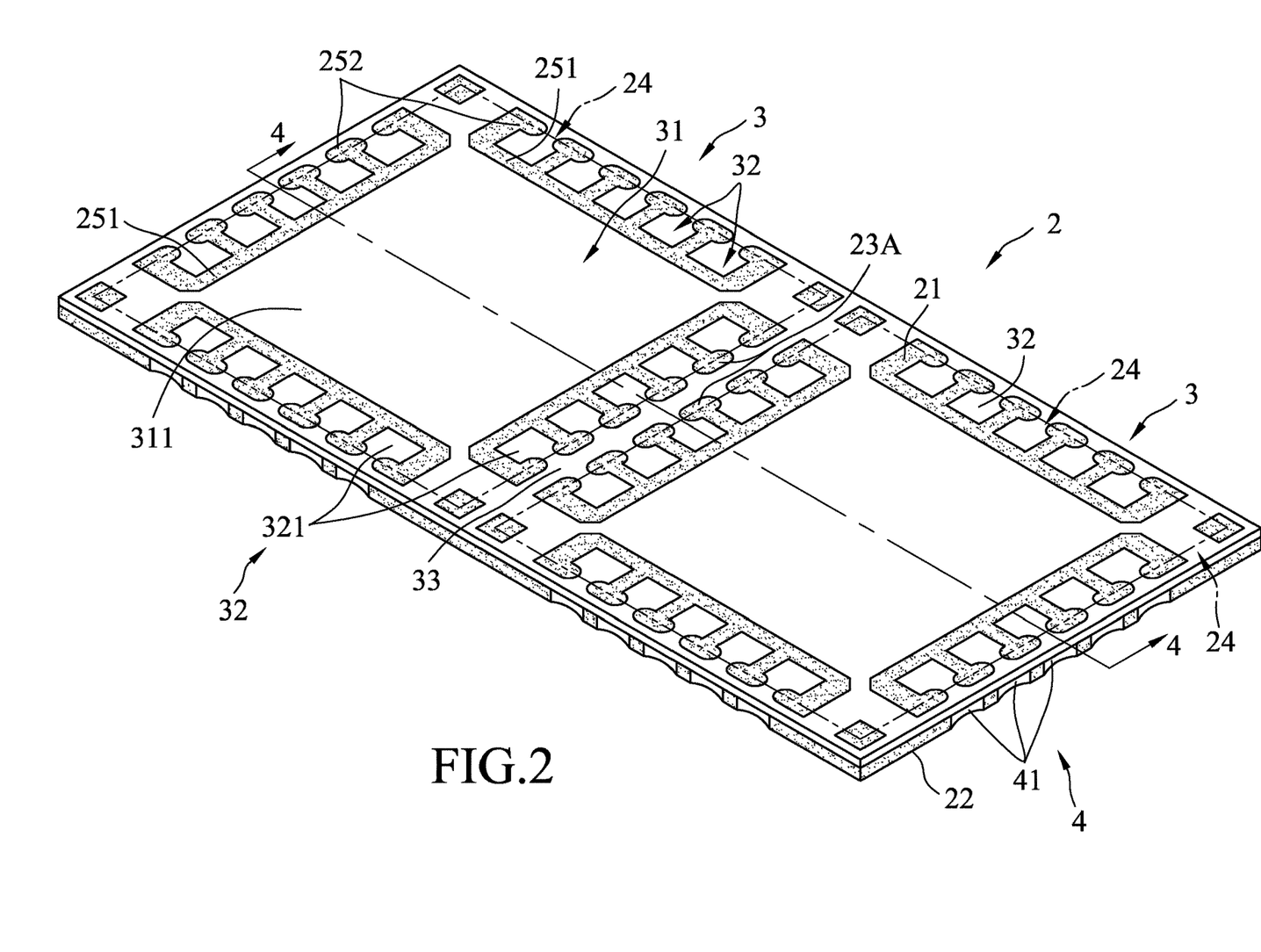
FIG. 2 is a perspective top view of an embodiment of a preformed lead frame according to the disclosure.
Figure 3:
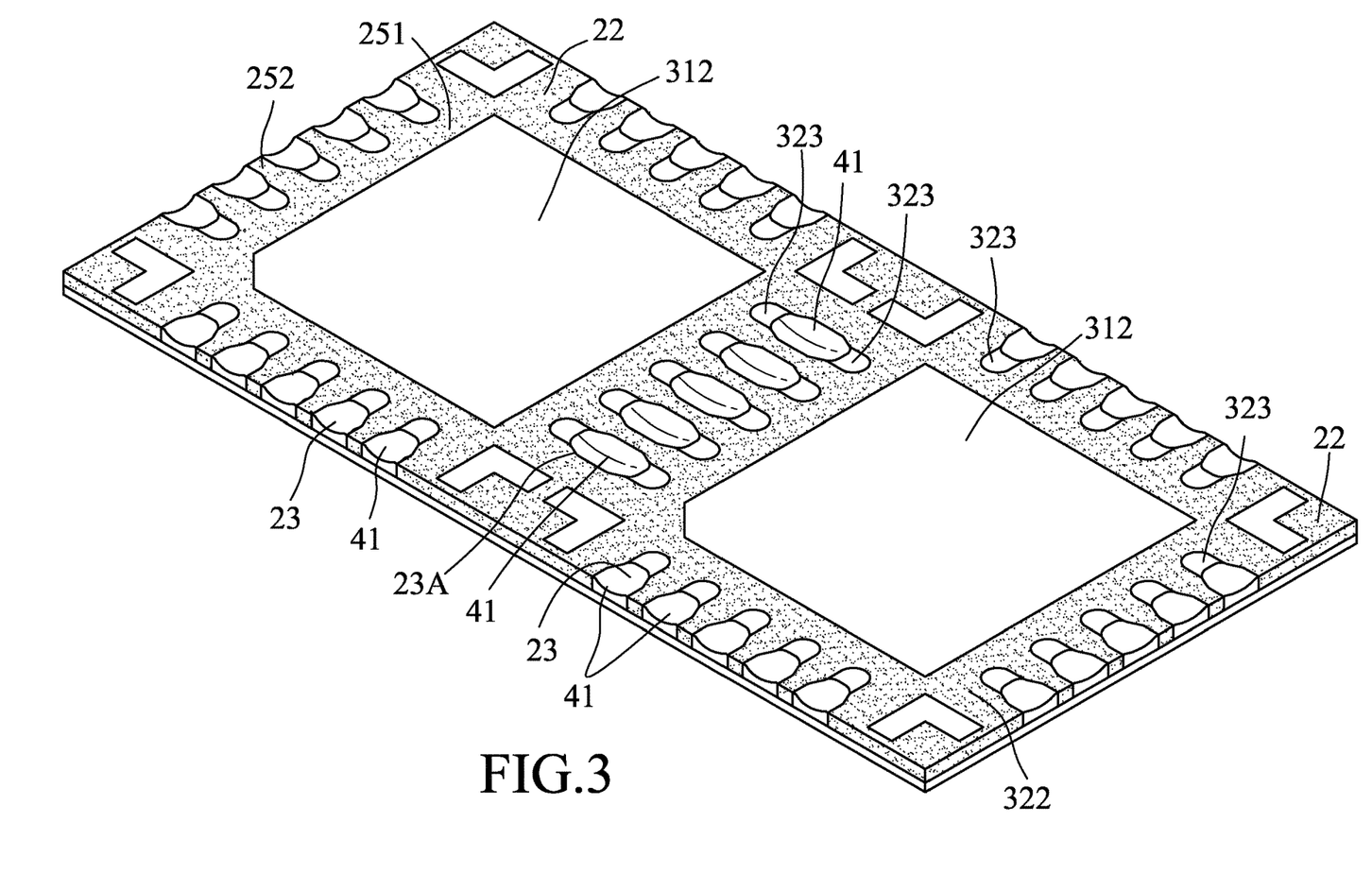
FIG. 3 is a perspective bottom view of the embodiment.
Figure 4:
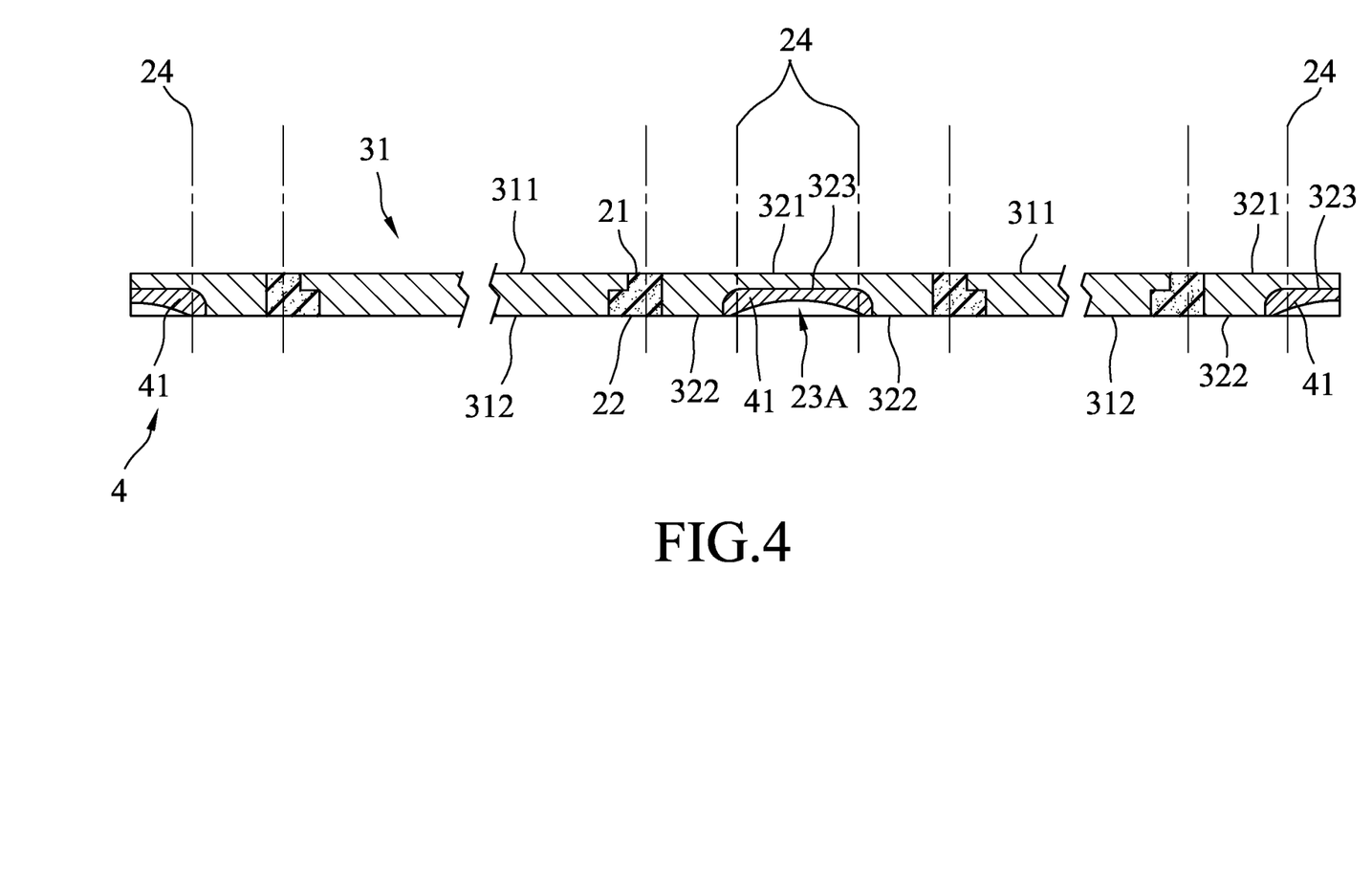
FIG. 4 is a sectional view of the embodiment taken along the line 4-4 of FIG. 2.

Referring to FIGS. 2 to 4, FIG. 2 is a perspective top view of an embodiment of a preformed lead frame according to the disclosure, FIG. 3 is a perspective bottom view of the embodiment, and FIG. 4 is a sectional view of the embodiment taken along the line 4-4 of FIG. 2.

The embodiment of the preformed lead frame includes a molding layer 2, at least two lead frame units 3, at least one connecting member 33 extending along at least one scribe line 24 and connecting the at least two lead frame units 3, and a solder unit 4. In this embodiment, as an example, the preformed lead frame includes two of the lead frame units 3, one of the connecting member 33 and two of the scribe lines 24 respectively defining boundaries of the two lead frame units 3.

The molding layer 2, which may be made of an electrically insulating polymer, is molded over the two frame units 3 and the connecting member 33. The molding layer 2 has an upper surface 21, a lower surface 22 opposite to the upper surface 21, and a plurality of spaced-apart elongated grooves 23A indented from the lower surface 22 toward the upper surface 21.

The molding layer 2 is also formed with two framed portions 251 that respectively surround the two lead frame units 3, and two surrounding frame portions 252 that respectively and connectively surround the two framed portions 251, and that respectively extend along the two scribe lines 24. Each of the framed portions 251 and the surrounding frame portions 252 extends between the upper and lower surface 21, 22.

Figure 9:
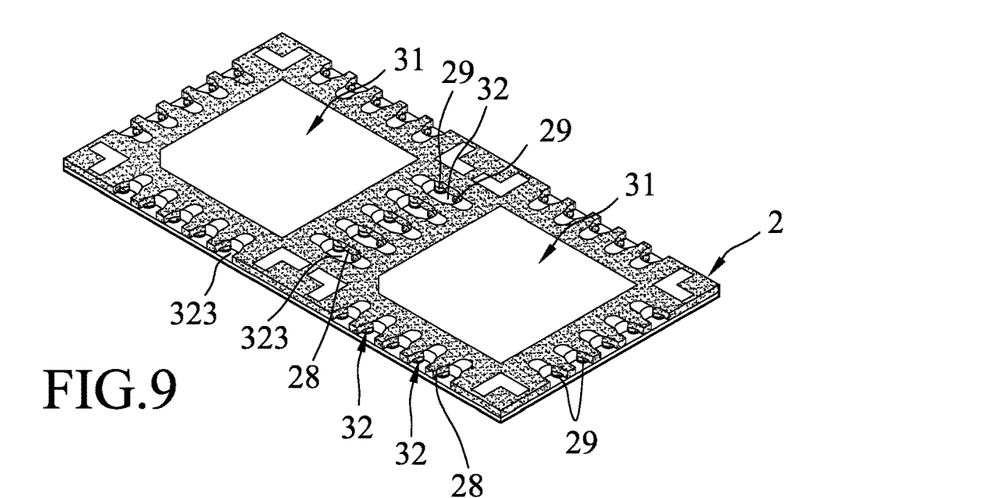

Further referring to FIG. 9, the molding layer 2 also includes a plurality of side surfaces 28 each extending between the upper and lower surfaces 21, 22 and surrounding a respective one of the elongated grooves 23A. The molding layer 2 may further include a plurality of step formations 29. Each of the step formations 29 protrudes from a corresponding one of the side surfaces 28 into a corresponding one of the elongated grooves 23A. Each of the step formations 29 has a thickness smaller than a half of a maximum depth of the corresponding elongated groove 23A. The depth of each of the elongated grooves 23A is measured from the lower surface 22 of the molding layer 2, and the thickness of each of the step formations 29 is measured along a direction of the depth of the corresponding elongated groove 23A.

Each of the two lead frame units 3 may be formed of an electroconductive material, and includes a row of spaced-apart leads 32. The leads of one of the two lead frame units 3 are respectively and alignedly connected to the leads 32 of the other one of the lead frame units 3 via the connecting member 33. Each of the leads 32 has a wire connecting surface 321 exposed from the upper surface 21 of the molding layer 2, a grooved surface 322 opposite to the wire connecting surface 321 and exposed from the lower surface 22 of the molding layer 2, and a grooved soldering surface 323 indented from the grooved surface 322 towards the upper surface 21 of the molding layer 2 and exposed in one of the elongated grooves 23A.

In one form, the wire connecting surface 321 of each of the leads 32 is coplanar with the upper surface 21 of the molding layer 2 and the grooved surface 322 of each of the leads 32 is coplanar with the lower surface 22 of the molding layer 2.

In one form, each of the elongated grooves 23A extends through the two scribe lines 24 and has two opposite groove ends respectively bordered by the grooved surfaces 322 of corresponding two of the leads 32 that are alignedly connected to each other. Each of the elongated grooves 23A has a first width along the two scribe lines 24 which the elongated grove 23A extends through and two second widths at the two opposite groove ends. The first width may be equal to the second widths, i.e., the width of each of the elongated grooves 23A is uniform. Alternatively, the first width may be larger than the second widths, i.e., the width of each of the elongated grooves 23A may be gradually decreased from the two scribe lines 24 toward said two opposite groove ends, respectively.

Each of the two lead frame units 3 further includes a die pad 31 embedded in a corresponding one of the framed portions 251 of the molding layer 2 and spaced apart from and surrounded by the leads 32. Each of the die pads 31 has a pad top surface 311 exposed from and coplanar with the upper surface 21 of the molding layer 2 and a pad bottom surface 312 exposed from and coplanar with the lower surface 22 of the molding layer 2.

In particular, the leads 32 are electrically independent of each other, and may be made of an electroconductive material identical to that of the die pads 31, such as copper, copper alloy, iron-nickel alloy, etc.

The solder unit 4 includes a plurality of solder layers 41 each filling a respective one of the elongated grooves 23A. Each of the solder layers 41 covers the grooved soldering surface 323 of the respective elongated groove 23A and is connected to a portion of the respective side surface 28 of the molding layer 2 exposed in the respective elongated groove 23A, so as to encapsulate metal burrs formed during the sawing process after the lead frame packages made of the preformed lead frame are formed, and to increase the bonding strength between the leads 32 and the molding layer 2 to prevent separation of the two during the sawing process. In addition, the solder layers 41 may be beneficial in increasing a reflow rate when the lead frame package is being soldered using a soldering material to an external circuit board (not shown), so as to increase the visibility of the process and to enhance efficiency in quality controls.

In particular, the solder layers 41 are made of tin-based alloys identical or similar to the soldering material used for the subsequent packaging process. In one form, each of the solder layers 41 fills at least ½ of a volume of the respective elongated groove 23A.

In the following, the production of the preformed lead frame of disclosure is illustrated.

Figure 5:
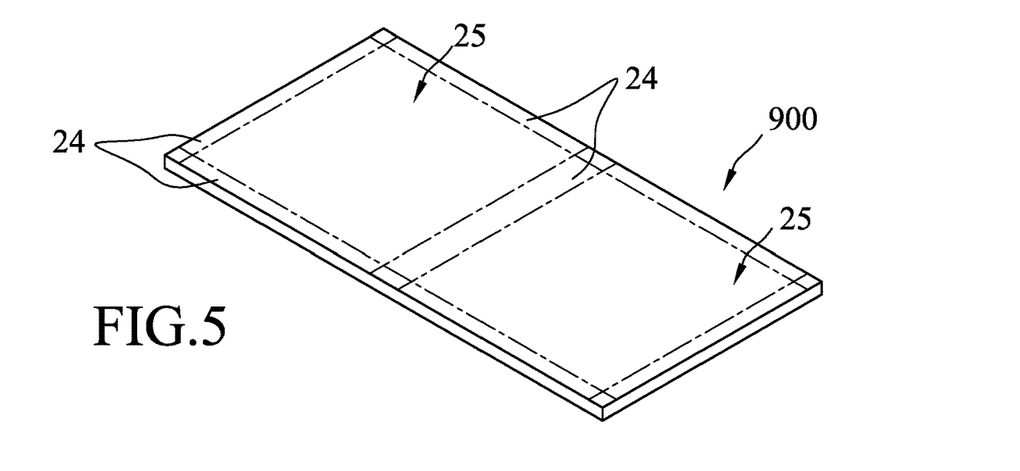
FIGS. 5 to 10 are perspective views illustrating consecutive steps for producing the embodiment of the preformed lead frame.

Referring to FIG. 5, an electrically conductive substrate 900 is provided, which may be made from copper alloys or iron-nickel alloys. The scribe lines 24 and spaced-apart chip mounting units 25, each of which is framed by a corresponding one of the scribe lines 24, are defined. In this embodiment, the number of the scribe lines 24 is the same as that of the chip mounting units 25 to be two.

Figure 6:
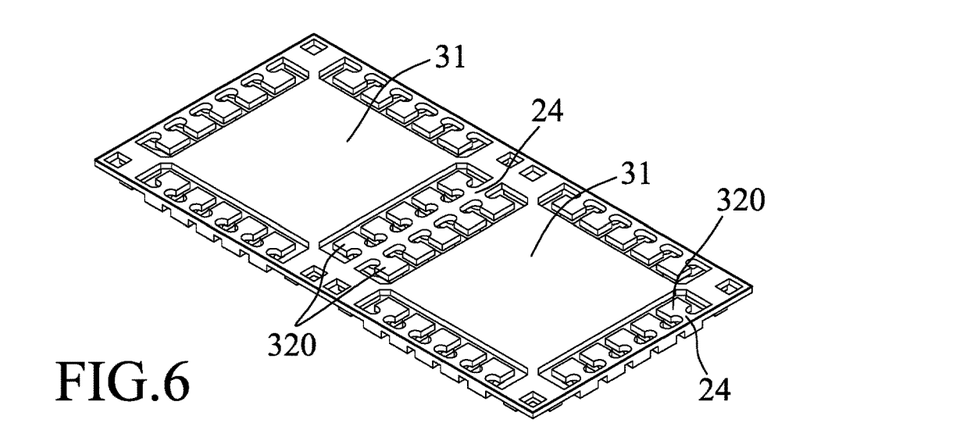
Figure 7:
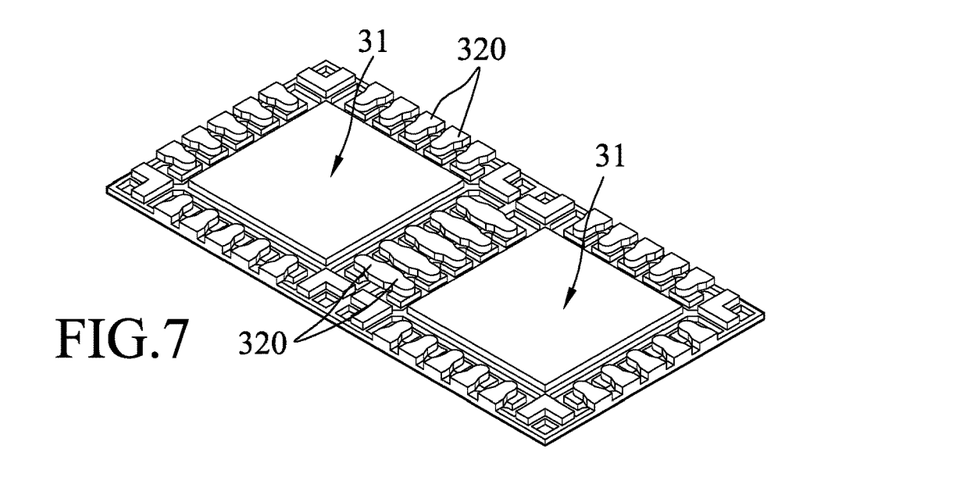
Figure 8:
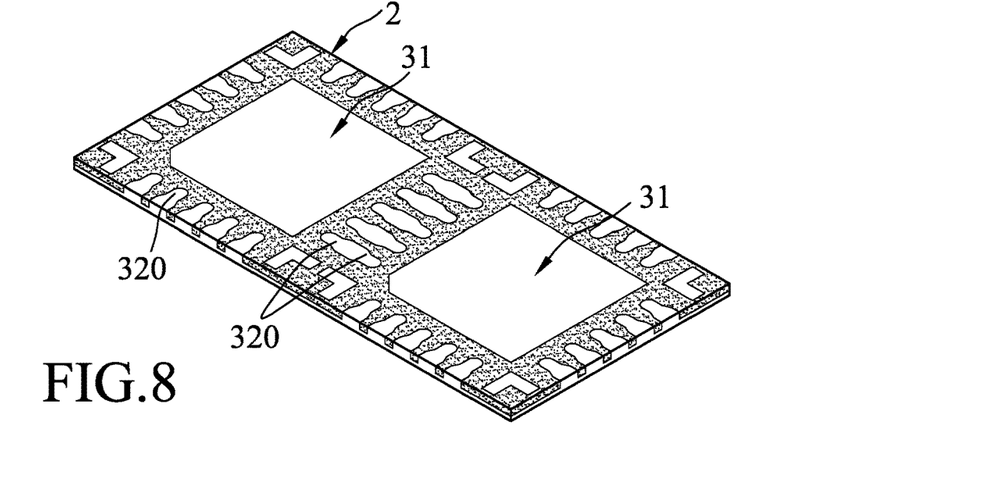

Then, referring to FIGS. 6 and 7, a first etching is performed on the substrate 900, during which unnecessary portions of the substrate 900 are removed. From the first etching, two of the die pads 31 are respectively preformed on the substrate 900 in positional correspondence with the chip mounting units 25. A plurality of semi-formed leads 320 are formed, each of which extends from a corresponding one of the scribe lines 24 to a neighboring one of the die pads 31 and is spaced-apart from the neighboring die pad 31. The substrate 900 that has gone through the first etching process is then sandwiched within a mold (not shown), and then a molding material is injected into the mold, filling the spaces formed in the substrate 900 after etching. The molding material may be an electrically insulating packaging material, such as epoxy resin. The molding material is solidified to form the molding layer 2, thereby obtaining a semi-finished product. FIG. 8 shows the back surface of the semi-finished product.

Then, referring back to FIG. 9, a second etching is performed on the back surface of the semi-finished product. FIG. 9 shows the back view of the preformed lead frame after etching.

In particular, the second etching involves etching from bottom surfaces of the semi-formed leads 320 toward the top surface of the semi-formed leads 320 in positional correspondence with the scribe lines 24 and neighboring areas of the scribe lines 24 so as to form the elongated grooves 23A. The semi-formed leads 320 remaining after the second etching process form the leads 32. Each of the leads 32 has a grooved soldering surface 323 exposed from the corresponding elongated grooves 23A.

Figure 10:
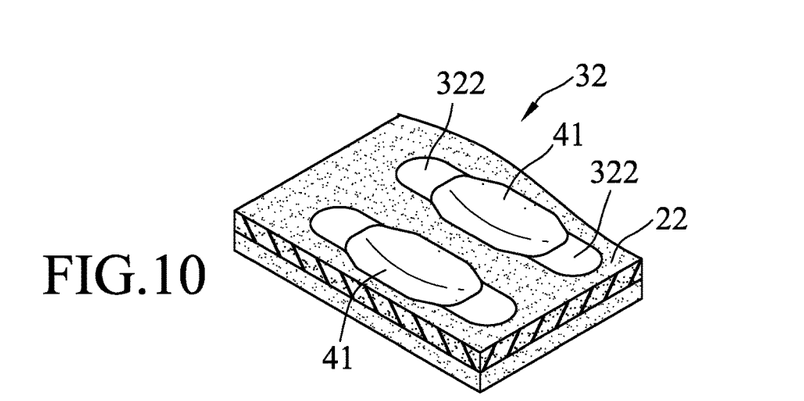

Finally, referring to FIG. 10, which is a partial magnified view of FIG. 9, in combination with FIGS. 4 and 9, the soldering material is filled in the elongated grooves 23A so as to cover the grooved soldering surface 323 exposed from each of the elongated grooves 23A and to cover each of the side surfaces 28 of the molding layer 2 exposed in the respective elongated groove 23A, thereby resulting in the preformed lead frame as illustrated in FIG. 4.

Figure 11:
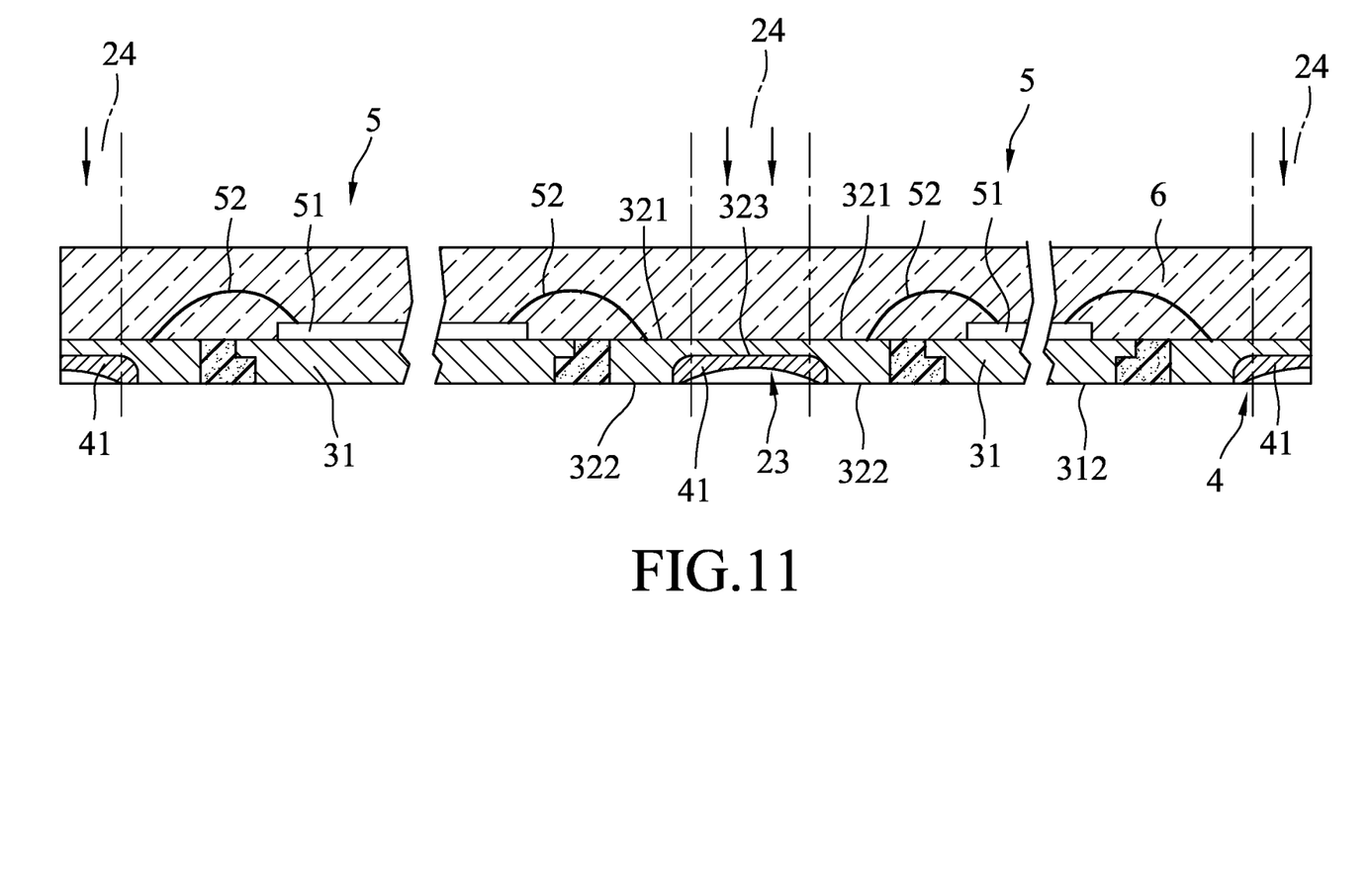
FIG. 11 is a fragmentarily schematic view illustrating a semi-finished product of an embodiment of a lead frame package according to the disclosure.

Referring to FIG. 11, when the aforementioned preformed lead frame is being packaged, first the pad top surface 311 of each of the die pads 31, which are respectively embedded in the framed portions 251 of the molding layer 2, is provided with a chip 51. Then a plurality of wires 52 are formed by the wire bonding process, which bonds the chips 51 with the leads 32 so as to form the chip unit 5. The product is then encapsulated with another electrically insulating polymer, forming an encapsulant layer 6 to form the semi-finished product as illustrated in FIG. 11.

Figure 12:
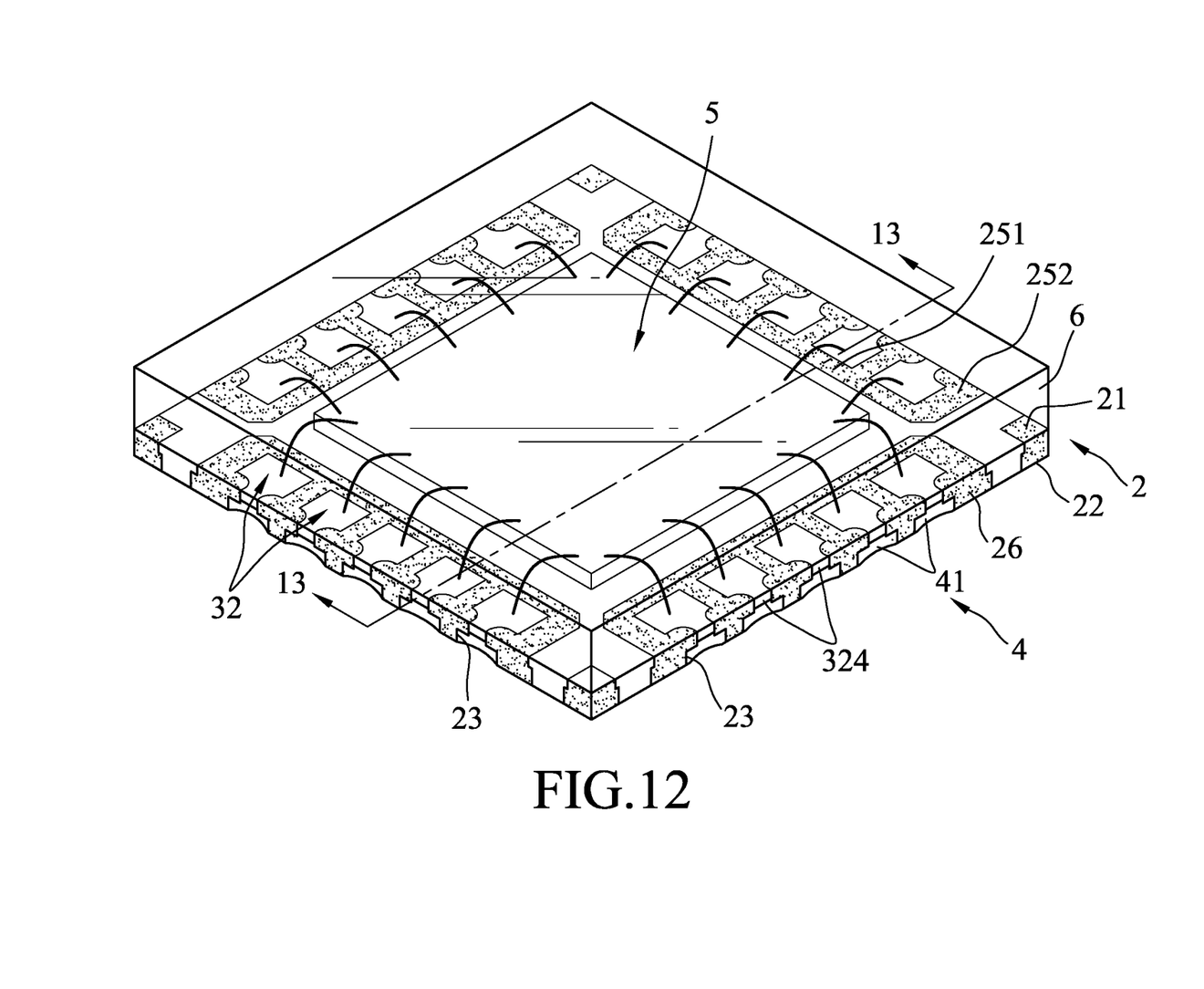
FIG. 12 is a perspective view illustrating a final product of the lead frame package according to the disclosure.

Finally, the semi-finished product is sawed along the scribe lines 24 (as illustrated by arrows) to get a singulated lead frame package as illustrated by FIG. 12.

Figure 13:
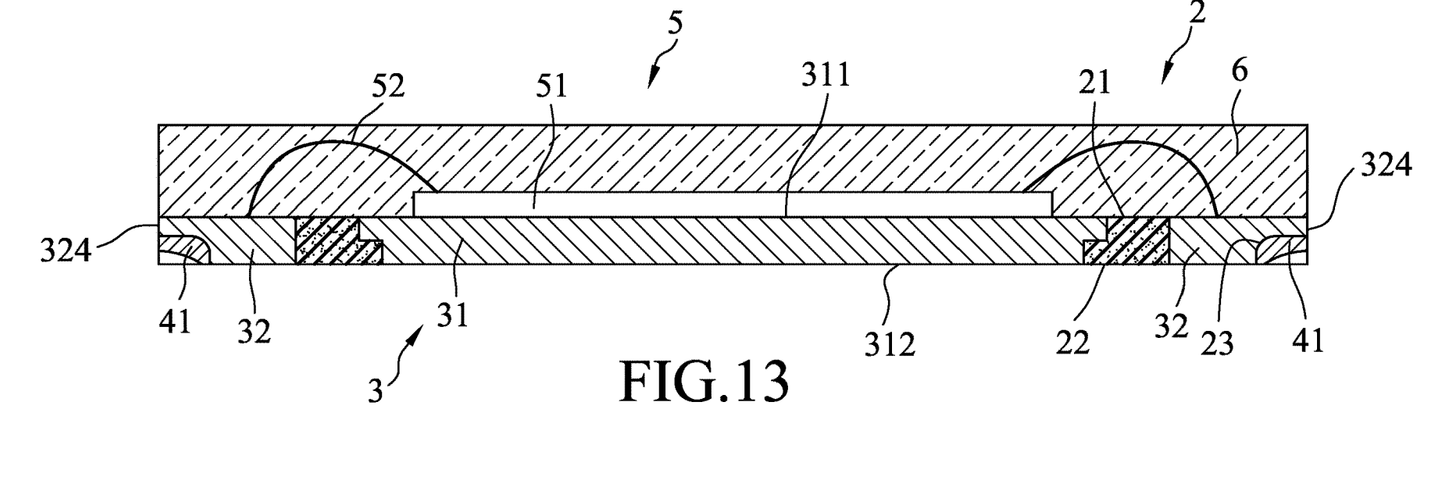
FIG. 13 is a schematic view of FIG. 12.

In the following, referring to FIGS. 12 to 13 in combination with FIG. 11, an embodiment of the lead frame package made from the preformed lead frame of disclosure is illustrated. FIG. 13 is a sectional view of the embodiment of the lead frame package taken along line 13-13 of FIG. 12.

The embodiment includes the molding layer 2, the lead frame unit 3, the solder unit 4, and the chip unit 5. The molding layer 2 may be made of an electrically insulating polymer, and has the opposite upper and lower surfaces 21, 22, a lateral surface 26 interconnecting the upper and lower surfaces 21, 22, the framed portion 251, and the surrounding frame portion 252 connectively surrounding the framed portion 251. Both of the framed portion 251 and the surrounding frame portion 252 extend through the upper and lower surfaces 21, 22 and the surrounding frame portion 252 is enclosed by the lateral surface 26.

The lead frame unit 3 is formed of an electroconductive material, and includes a plurality of the spaced-apart leads 32 that are electrically independent of each other and are embedded in the surrounding frame portion 252.

The lead frame package further includes the die pad 31 embedded in the framed portion 251 of the molding layer 2. The die pad 31 has the pad top surface 311 exposed from and coplanar with the upper surface 21 of the molding layer 2 and a pad bottom surface 312 exposed from and coplanar with the lower surface 22 of the molding layer 2 and is spaced apart from the leads 32. The die pad 31 and the leads 32 may be made of the same electrically conducting material, examples include, but are not limited to, cooper alloys or iron-nickel alloys.

Each of the leads 32 has one of the wire connecting surfaces 321 exposed from the upper surface 21 of the molding layer 2, the grooved surface 322 opposite to the wire connecting surface 321 and exposed from the lower surface 22 of the molding layer 2, and a grooved soldering surface 323 indented from the grooved surface 322 towards the upper surface 21 of the molding layer 2. The grooved soldering surface 323 of each of the leads cooperate with the molding layer 2 to define a solder-receiving groove 23, which extends from the bottom surface 22 to the lateral surface 26 of the molding layer 2.

In one form, the wire connecting surface 321 of each of the leads 32 is coplanar with the upper surface 21 of the molding layer 2 and the grooved surface 322 of each of the leads 32 is coplanar with the lower surface 22 of the molding layer 2.

In particular, for each of the solder-receiving grooves 23, the first width is defined in a portion thereof adjacent to the lateral surface 26, while the second width is defined in a portion thereof adjacent to the grooved surface 322 of the respective lead 32. The first width may be identical to or larger than the second width. The size of each one of the solder-receiving grooves 23 can be adjusted based on different first width and second width. Each of the step formations 29 protrudes from a corresponding one of the side surfaces 28 into a corresponding one of the solder-receiving grooves 23.

The solder layers 41 of the solder unit 4 respectively fill the solder-receiving grooves 23.

The chip 51 of the chip unit 5 is disposed on the pad top surface 311 of the die pad 3 which is embedded in the framed portion 251 of the molding layer 2 and the wires 52 are connected between the chip 51 and the leads 32.

In addition, when the lead frame package is of a smaller dimension or has a low requirement in heat dissipation, the framed portion 251 of the molding layer 2 may serve as the die pad 31 and the chip 51 may be directly disposed thereon.

Figure 14:
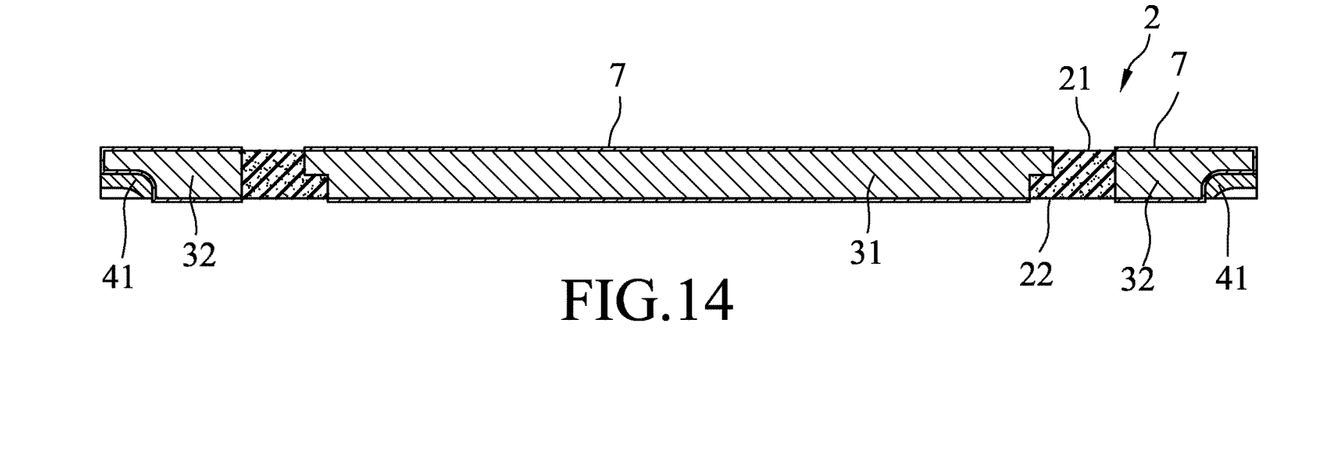
FIG. 14 is a schematic view illustrating the embodiment of the preformed lead frame further having an electroplating layer.

In certain embodiments, an electroplating process may be further conducted after forming the preformed lead frame as shown in FIG. 9, such that one or more electroplating layers 7 may further be formed before the packaging process. The one or more electroplating layers 7 may be formed on the wire connecting surfaces 321 of the leads 32, the pad top surfaces 311 of the die pads 31, the grooved surfaces 322 and the grooved soldering surfaces 323 of the leads 32. FIG. 14 shows one electroplating layer 7 formed on the preformed lead frame constituting one lead frame package as an example. In FIG. 14, the electroplating layer 7 is further formed on the grooved surface 322 and the grooved soldering surface 323 of each of the leads 32 and the pad bottom surface 312 of each of the die pads 31. The electroplating layer 7 may be made from a material different from that of the leads 32 and the die pad 31. The electroplating layer 7 may be made from a metal, for example, but not limited to, nickel, palladium, silver, gold, or alloys thereof. The electroplating layer 7 can improve the wettability between the solder and the leads 32 such that the solder can more easily rise on the grooved soldering surface 323, thereby increasing the connections of the preformed lead frame with the encapsulant layer 6 and the wires 52.

In view of the foregoing, due to the structural design of the preformed lead frame, which is formed with the preformed elongated grooves 23A, the elongated grooves 23A being pre-filled with solder layers 41, the metal burrs formed during the sawing process may be encapsulated by the solder layers 41, and the bonding strength between the leads 32 and the molding layer 2 may be increased, thereby reducing the separation of the leads 32 and the molding layer 2 during the sawing process. Furthermore, the lead frame package formed from sawing the preformed lead frame has the solder-receiving grooves 23 and the step formations 29 which increases the contact area between the solder layers 41 and the leads 32, thereby increasing the reflow rate of the solder subsequently applied to the solder layers 41, and makes visual inspection of the soldering condition easier.

In the description above, for the purpose of explanation, numerous specific details have been set forth in order to provide a thorough understanding of the embodiment. It will be apparent, however, to one skilled in the art, that one or more other embodiments maybe practiced without some of these specific details. It should also be appreciated that reference throughout this specification to"one embodiment, '""an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A preformed lead frame, comprising:
    at least two lead frame units;
    at least one connecting member extending along a scribe line and connected between said at least two lead frame units;
    a molding layer molded over said at least two lead frame units and said at least one connecting member, said molding layer having opposite upper and lower surfaces, a plurality of spaced apart elongated grooves that are indented from said lower surface toward said upper surface, and a plurality of side surfaces, each of said side surfaces extending between said upper and lower surfaces and surrounding a respective one of said elongated grooves; and
    a solder unit including a plurality of solder layers, each of said solder layers filling a respective one of said elongated grooves,
    wherein each of said at least two lead frame units includes a row of spaced-apart leads, said leads of one of said at least two lead frame units being respectively and alignedly connected to said leads of the other one of said at least two lead frame units via said at least one connecting member, each of said leads having a wire connecting surface exposed from said upper surface of said molding layer, a grooved surface opposite to said wire connecting surface and exposed from said lower surfaces of said molding layer, and a grooved soldering surface indented from said grooved surface towards said upper surface of said molding layer and exposed in one of said elongated grooves; and
    wherein each of said solder layers covers said grooved soldering surface of said respective elongated groove and is connected to a portion of the respective side surface of said molding layer exposed in said respective elongated groove.

2. The preformed lead frame according to claim 1, wherein each of said solder layers fills at least ½ of a volume of a respective elongated groove.

3. The preformed lead frame according to claim 1, wherein said wire connecting surface of each of said leads is coplanar with said upper surface of said molding layer, said grooved surface of each of said leads being coplanar with said lower surface of said molding layer.

4. The preformed lead frame according to claim 1, wherein said molding layer further includes a plurality of step formations, each of which protrudes from a corresponding one of said side surface into a corresponding one of said elongated grooves.

5. The preformed lead frame according to claim 1, wherein said molding layer includes at least two framed portions that respectively surround said at least two lead frame units, and at least two surrounding frame portions that respectively and connectively surround said at least two framed portions; and wherein each of said at least two lead frame units includes a die pad embedded in said molding layer and spaced apart from and surrounded by said leads, said die pad of each of said at least two lead frame units having a pad top surface exposed from and coplanar with said upper surface of said molding layer and a pad bottom surface exposed from and coplanar with said lower surface of said molding layer.

6. The preformed lead frame according to claim 5, further comprising an electroplating layer formed on said wire connecting surfaces of said leads and said pad top surface of each of said die pads, said electroplating layer being made of a material different from that of said leads.

7. The preformed lead frame according to claim 6, wherein said electroplating layer is further formed on said grooved surface and said grooved soldering surface of each of said leads and said pad bottom surface of each of said die pads.

8. The preformed lead frame according to claim 1, wherein said molding layer is made from an electrically insulating material and each of said at least two frame units being formed of an electroconductive material.

9. A lead frame package comprising:
a molding layer having opposite upper and lower surfaces, a lateral surface that interconnects said upper and lower surfaces, a framed portion that extends between said upper and lower surfaces, and a surrounding frame portion that extends between said upper and lower surfaces and that connectively surrounds said framed portion;
a lead frame unit including a plurality of spaced-apart leads embedded in said surrounding frame portion of the molding layer, each of said leads having a wire connecting surface that is exposed from said upper surface of said molding layer, a grooved surface that is opposite to said wire connecting surface and that is exposed from said lower surface of said molding layer, and a grooved soldering surface that is indented from said grooved surface towards said upper surface of said molding layer, said grooved soldering surface of each of said leads cooperating with said molding layer to define a solder-receiving groove;
a solder unit including a plurality of solder layers, each of said solder layers filling a respective one of said solder-receiving groove; and
a chip unit including a chip that is disposed on said framed portion of said molding layer, and a plurality of wires that are connected between said chip and said wire connecting surfaces of said leads.

10. The lead frame package according to claim 9, wherein said wire connecting surface of each of said leads is coplanar with said upper surface of said molding layer, said grooved surface of each of said leads being coplanar with said lower surface of said molding layer.

11. The lead frame package according to claim 9, wherein said molding layer further includes a plurality of step formations, each of which protrudes from a corresponding one of said side surface into a corresponding one of said elongated grooves.

12. The lead frame package according to claim 9, wherein said lead frame unit further includes a die pad embedded in said framed portion of said molding layer and spaced apart from said leads, said die pad having a pad top surface that is exposed from and that is coplanar with said upper surface of said molding layer, and a pad bottom surface that is exposed from and that is coplanar with said lower surface of said molding layer, said chip being mounted on said pad top surface.

13. The lead frame package according to claim 12, further comprising an electroplating layer formed on said wire connecting surfaces of said leads and said pad top and bottom surfaces of each of said die pads, said electroplating layer being made of a material different from that of said leads.

14. The lead frame package according to claim 13, wherein said electroplating layer is further formed on said grooved surface and said grooved soldering surface of each of said leads and said pad bottom surface of each of said die pads.

15. The lead frame package according to claim 9, wherein said molding layer is made from an electrically insulating material and said frame unit being formed of an electroconductive material.

16. The lead frame package according to claim 9, further comprising an encapsulant layer that encapsulates said chip unit.

* * * * *